United States Patent [19]

Tateishi et al.

[11] 4,332,001
[45] May 25, 1982

[54] MOUNTING STRUCTURE FOR PRINTED CIRCUIT BOARD

[75] Inventors: Masaaki Tateishi, Soma; Shoji Shinbo, Haramachi, both of Japan

[73] Assignee: Alps Electric Co., Ltd., Tokyo, Japan

[21] Appl. No.: 127,729

[22] Filed: Mar. 6, 1980

[30] Foreign Application Priority Data

Mar. 8, 1979 [JP] Japan .............................. 54-29680[U]

[51] Int. Cl.³ .............................................. H05K 1/18
[52] U.S. Cl. ................................. 361/399; 219/85 M; 228/6 A; 228/44.1 A; 228/49 C; 228/180 R; 361/419
[58] Field of Search ............ 219/85 M, 85 CM, 85 F; 361/415, 399, 419, 394, 421, 422; 228/6 A, 44.1 A, 49 R, 180 R, 180 A, 212, 255, 49 C

[56] References Cited

U.S. PATENT DOCUMENTS

| | | | |
|---|---|---|---|
| 2,055,393 | 9/1936 | Thomas | 219/85 CM |
| 2,932,771 | 4/1960 | Craven | 361/429 |
| 3,145,325 | 8/1964 | Whipple | 361/415 |
| 3,258,649 | 6/1966 | Arguin | 361/415 X |
| 3,270,399 | 9/1966 | Ohntrup | 361/421 X |
| 3,678,343 | 7/1972 | Duyne | 361/415 X |
| 3,699,393 | 10/1972 | Reimer | 361/415 |
| 3,863,113 | 1/1975 | Ward | 361/415 |
| 4,002,953 | 1/1977 | Tetlie | 361/415 |

FOREIGN PATENT DOCUMENTS

| | | | |
|---|---|---|---|
| 37653 | 4/1965 | U.S.S.R. | 361/415 |
| 581604 | 12/1977 | U.S.S.R. | 361/422 |

OTHER PUBLICATIONS

Irwin Schuster, 8 More Printed-Circuit Guides, Product Engineering, Jun. 1963.

*Primary Examiner*—Richard R. Kucia
*Attorney, Agent, or Firm*—Guy W. Shoup; Gerard F. Dunne

[57] ABSTRACT

In order to assist the mounting of a printed circuit board to a metallic frame and the soldering of a conductive pattern of the former to the latter, a wire rod of high solderability is bent to conform substantially with the outline of the frame and is disposed at the juncture between the frame and the marginal edge of the circuit board. The circuit board can thus be temporarily fixed to the frame by the resilience of the wire rod and then subjected to dip soldering.

5 Claims, 7 Drawing Figures

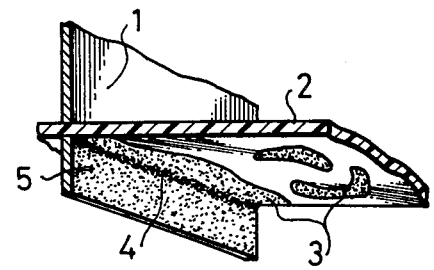
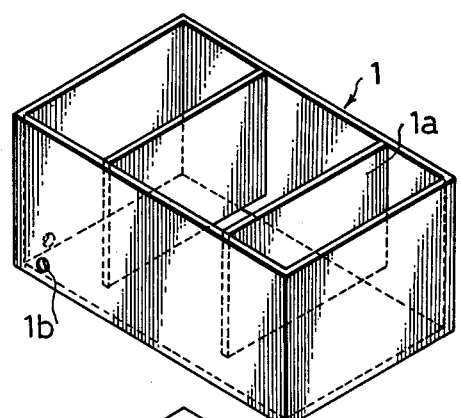
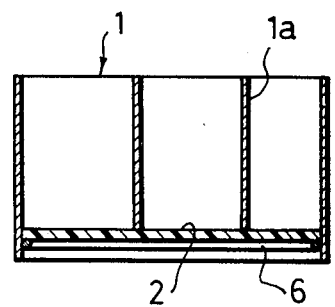
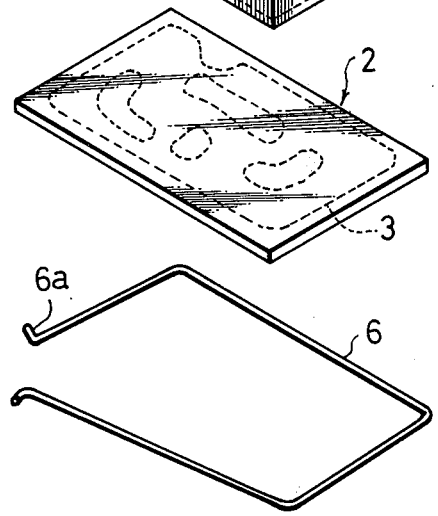
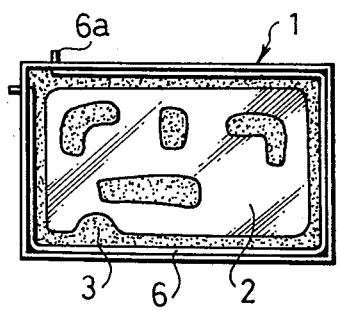

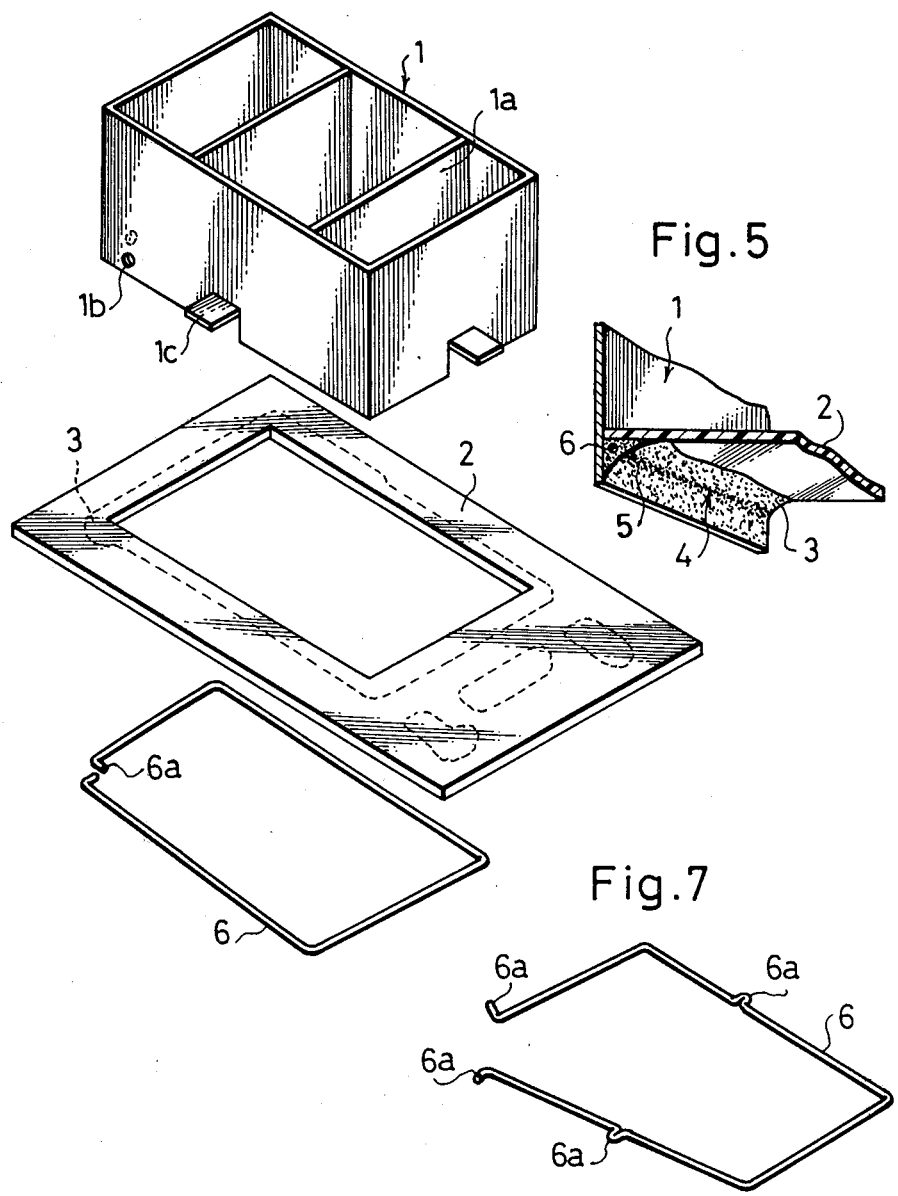

MOUNTING STRUCTURE FOR PRINTED CIRCUIT BOARD

The present invention relates to a mounting structure for a printed circuit board. More particularly, it relates to such a structure for installing a printed circuit board to a metallic frame or the like, with the mounting structure being particularly suited to connect the frame both electrically and mechanically to the printed circuit board by known dip soldering techniques.

A known structure for mounting a p.c. board to a metallic frame is shown in FIG. 1. An end part of the p.c. board 2 is inserted into a metallic frame 1, and the frame 1 and a conductive pattern 3 of the printed circuit board 2 are connected both electrically and mechanically at the juncture or boundary 4 between the members 1 and 2 by dip soldering techniques.

It has been empirically known, however, that when the juncture 4 between the frame 1 and the printed circuit board 2 is pulled upwardly from the molten solder bath in the dip soldering process, the solder 5 adheres poorly at the juncture 4 and deposits on this juncture only slightly. For this reason, the mechanical strength sufficient for the soldering connection of the juncture 4 cannot be attained. Especially in the case where there is a minute space between the frame 1 and the printed circuit board 2, the adhesion of the solder 5 at the juncture 4 is very inferior, and the electrical contact between the frame 1 and the conductive pattern 3 of the printed circuit board 2 is unstable, and, of course, there is insufficient mechanical strength at the junction. This leads to the disadvantage that a satisfactory shielding effect of the metallic frame cannot be achieved in radio frequency appliances such as tuners.

It is therefore an object of the present invention to provide a mounting structure for a printed circuit board which can connect a frame and a conductive pattern of the printed circuit board reliably both electrically and mechanically.

Another object of the present invention is to provide such a structure which is suitable for use with known dip soldering techniques.

Still another object of the present invention is to provide such a structure which can temporarily fasten a printed circuit board to a frame before soldering.

In order to accomplish the objects, according to the present invention, a wire rod of good solderability is disposed against abutting portions of the printed circuit board and metallic frame, thereby to increase the substantial connection area of the abutting portion (juncture) so that the two members may be connected electrically and mechanically reliably.

Further objects and advantages of the present invention will become apparent from the following description taken with reference to the drawings, wherein FIG. 1 is a perspective view showing an example of a prior art structure for fixing a printed circuit board to a metallic frame.

FIG. 2 is an exploded perspective view of an embodiment of the present invention.

FIG. 3 is a sectional side view showing a state in which a printed circuit board has been temporarily fixed to a frame in the present invention.

FIG. 4 is a bottom view of the fixed structure in FIG. 3, as seen from its bottom.

FIG. 5 is a perspective view of essential portions showing a state after the juncture between the printed circuit board and the frame has been soldered.

FIG. 6 is an exploded perspective view showing another embodiment of the present invention.

FIG. 7 is a perspective view showing another aspect of a wire rod in the present invention.

The present invention will first be described in conjunction with an embodiment thereof shown in FIGS. 2 to 5.

Numeral 1 designates a box-shaped frame made of a tinned iron sheet or the like and having the upper and lower portions thereof open. Shielding plates 1a are disposed across the frame 1.

Numeral 2 designates a printed circuit board which has conductive patterns 3 formed appropriately on its rear surface. The printed circuit board 2 is substantially the same size as the lower open portion of the frame 1, and can be received therein.

Numeral 6 indicates a length of wire made from a material having good solderability and elasticity, such as steel wire with its outer peripheral surface tinned. As illustrated in FIG. 2, the wire length 6 is constructed by a single wire rod bent into a substantially rectangular shape with end parts bent outwardly to form engaging pieces 6a. The substantially rectangular wire rod 6 is adapted to normally spread outwards owing to its own elasticity, and is formed to be substantially the same size as that of the lower open portion of the frame 1 when the open ends are engaging.

In mounting the printed circuit board 2 on the frame 1, first of all, the printed circuit board 2 is inserted into the lower open portion of the frame 1 with the side having the conductive patterns 3 facing downwards. In this case, the circuit board 2 is inserted into the frame 1 until it abuts against one end of each shielding plate 1a. Subsequently, the substantially rectangular wire rod 6 is pressed to contract the substantially rectangular contour thereof. Under this state, the wire rod 6 is inserted into the lower open portion of the frame 1 so as to be placed against the underside of the printed circuit board 2, and the engaging pieces 6a of the wire rod 6 are brought into correspondence with engaging portions 1b such as apertures provided in the frame 1, whereupon the external force of the wire rod 6 is released. Then, the wire rod 6 spreads owing to its own elasticity, so that the engaging pieces 6a of the wire rod 6 come into engagement with the engaging portions 1b of the frame 1 and that the whole, substantially rectangular wire rod 6 comes into pressed contact with the inner walls of the frame 1. Thus, the printed circuit board 2 is prevented from falling out of the frame and is thus temporarily fixed therein.

At this time, the substantially rectangular wire rod 6 lies in a state in which it is located at the juncture 4 between the frame 1 and the printed circuit board 2.

At the next step, the printed circuit board 2 temporarily fastened to the frame 1 in this way is subjected to dip soldering. The wire rod 6 will thus increase substantially the connection area of the juncture 4 and enable the solder to be deposited in a very satisfactory manner, as illustrated in FIG. 5. The frame 1 and the printed circuit board 2 will thus be soldered firmly and reliably.

As thus far described, according to the present invention, the elastic and substantially rectangular wire rod 6 is brought into pressed contact with the frame 1 so as to mount the wire rod 6 on the frame 1 and to fix the printed circuit board 2 temporarily to the frame 1.

Therefore, the printed circuit 2 is held to the frame 1, and the soldering operation is facilitated. Also, the assemblage of the wire rod 6 for the temporary fixation of the printed circuit board 2 may be the simple operation of merely releasing the wire rod 6 in the state in which its contour is contracted, and the operation is very easy and affords a very high production efficiency. In addition, the wire rod 6 spreads itself owing to the elasticity of its own so as to come into pressed contact with the frame 1. Therefore, the wire rod 6 can be reliably located at the juncture 4 between the frame 1 and the printed circuit board 2, and the adhesion of the solder 5 to the juncture 4 by dip soldering can be made uniform. Further, the deposition of the solder 5 to the frame 1 as well as the printed circuit board 2 is improved by disposing the wire rod 6 at the juncture 4, so that the frame 1 and the printed circuit board 2 can be soldered rigidly and securely and that the mechanical strength and the stability of the electrical contact can be enhanced remarkably. The present invention achieves such various effects.

Although, in the above embodiment, the wire rod 6 has been described as being in the shape of a round rod, it may well be in the shapes of a prism, a cylinder, a strip etc. Although the printed circuit board 2 has been described as being situated inside the frame 1, it may well be situated outside the frame 1 as illustrated in FIG. 6. More specifically, the upward positioning of the printed circuit board 2 is performed by means of bent pieces 1c thereof which are provided in the frame 1 in a manner to be salient from the body thereof, and the substantially rectangular wire rod 6 is mounted so as to embrace the outer periphery of the frame 1 owing to the elasticity of its own, thereby to prevent the printed circuit board 2 from falling. In this case, in mounting the wire rod 6 on the frame 1, the wire rod 6 contracts owing to the elasticity of its own conversely to that in the foregoing embodiment.

Therefore, when the wire rod 6 is spread and applied onto the outer periphery of the frame 1, and then the external force is released, the wire rod 6 embraces the outer surfaces of the frame 1 owing to the elasticity thereof. Such modification may well be adopted. In addition, the engaging pieces 6a of the wire rod 6 can be formed in suitable places as shown in FIG. 7. It is a matter of course that all such modifications fall within the scope of the present invention.

In the case where the engaging pieces 6a are provided in the wire rod 6 and are brought into engagement with the engaging portions 1b of the frame 1, the temporary fixation of the wire rod 6 and the printed circuit board 2 can be made reliable.

What is claimed is:

1. In a structure for mounting a printed circuit board formed with a conductive pattern in at least a marginal edge thereof to a frame, wherein abutting portions between the marginal edge of the printed circuit board and the frame are to be soldered;

the improvement including means for holding said printed circuit board to said frame prior to soldering of said abutting portions and increasing the mechanical and electrical connection of said abutting portions by the soldering thereof, said means comprising a length of wire bent to conform substantially to the outline of the frame and being located at said abutting portions, said wire being resilient and being easily soldered, whereby said abutting portions inclusive of said wire may be soldered.

2. A mounting structure for a printed circuit board as defined in claim 1, wherein engaging members are respectively formed at end portions of said wire, while engaging portions adopted to coact said engaging members are provided in said frame, and said engaging members of said wire abut on said engaging portions of said frame so as to hold said wire on said frame.

3. A mounting structure for a printed circuit board as defined in claim 2, wherein said wire resiliently abuts on said frame owing to its own elasticity.

4. A mounting structure for a printed circuit board as defined in claim 2, wherein said wire is located on a lower surface of said printed circuit board so as to prevent said printed circuit board from falling out of said frame during the soldering.

5. A mounting structure for a printed circuit board as defined in claim 1, wherein said wire is a steel wire whose outer peripheral surface is tinned.

* * * * *